United States Patent [19]
Grubisich et al.

[11] Patent Number: 5,389,553
[45] Date of Patent: Feb. 14, 1995

[54] METHODS FOR FABRICATION OF TRANSISTORS

[75] Inventors: Michael J. Grubisich, San Jose; Ali A. Iranmanesh, Sunnyvale, both of Calif.

[73] Assignee: National Semiconductor Corporation, Santa Clara, Calif.

[21] Appl. No.: 85,436

[22] Filed: Jun. 30, 1993

[51] Int. Cl.$^6$ .................................... H01L 21/265
[52] U.S. Cl. ........................... 437/31; 437/162; 437/59; 148/DIG. 9
[58] Field of Search ............... 437/31, 162, 59, 34, 437/228; 148/DIG. 9

[56] References Cited

U.S. PATENT DOCUMENTS

| | | | |
|---|---|---|---|
| 4,400,865 | 8/1983 | Goth et al. | 156/643 |
| 4,738,624 | 4/1988 | Iyer et al. | 437/67 |
| 4,877,748 | 10/1989 | Havemann | 437/31 |
| 4,957,874 | 9/1990 | Soejima | 148/DIG. 9 |
| 4,975,381 | 12/1990 | Taka et al. | 437/31 |
| 5,024,957 | 6/1991 | Harame et al. | 437/31 |
| 5,039,624 | 8/1991 | Kadota | 437/31 |
| 5,075,241 | 12/1991 | Spratt et al. | 148/DIG. 9 |
| 5,098,853 | 3/1992 | Clark et al. | 437/31 |
| 5,139,966 | 8/1992 | Jerome et al. | 437/162 |
| 5,232,861 | 8/1993 | Miwa | 437/31 |

OTHER PUBLICATIONS

R. M. Warner, Jr., J. N. Fordemwalt, *Integrated Circuits* (McGraw-Hill, 1965), pp. 107–109.
E. S. Yang, *Fundamentals of Semiconductor Devices* (McGraw-Hill, 1978), pp. 241–243.
E. S. Yang, *Microelectronic Devices* (McGraw-Hill, 1988), pp. 134–135.
R. S. Muller, T. I. Kamins, *Device Electronics for Integrated Circuits* (Second Edition 1986), pp. 331–335.
A. Iranmandesh, M. Biswal and B. Bastani, *Total System Solution with Advanced BiCMOS*, Solid State Technology, Jul. 1992, pp. 37–40.
H. F. Cooke, *Microwave Transistors: Theory and Design*, pp. 68–86, reprinted from *Proc. IEEE*, vol. 59, Aug. 1971, pp. 1163–1181.
G. Gonzalez, "Microwave transistor amplifiers" (Prentice-Hall 1984), pp. 31–34.

Primary Examiner—Brian E. Hearn
Assistant Examiner—Tuan Nguyen
Attorney, Agent, or Firm—H. Donald Nelson; Michael Shenker; Stephen R. Robinson

[57] ABSTRACT

In a bipolar transistor, the collector and the base are formed in an isolation region laterally bounded by a field insulator. The isolation region corners are spaced far from the emitter to reduce the collector-emitter leakage current. The base does not extend laterally throughout the isolation region. Thus the base is small and the collector-base capacitance is small as a result. Those corners of the isolation region that are not covered by a base contact region are covered and contacted by an insulator. This insulator prevents the field insulator from being pulled back during wafer clean steps. Consequently, the field insulator does not expose the collector. Further, the insulator covering the corners prevents the metal silicide on the surface of the extrinsic base from contacting the corners. The insulator overlying the corners thus reduces the collector-base leakage current.

15 Claims, 13 Drawing Sheets

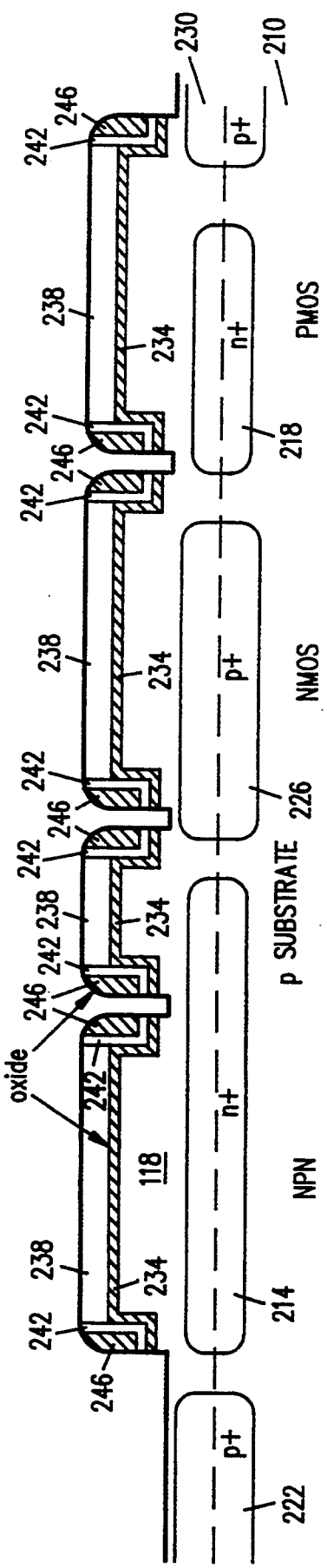
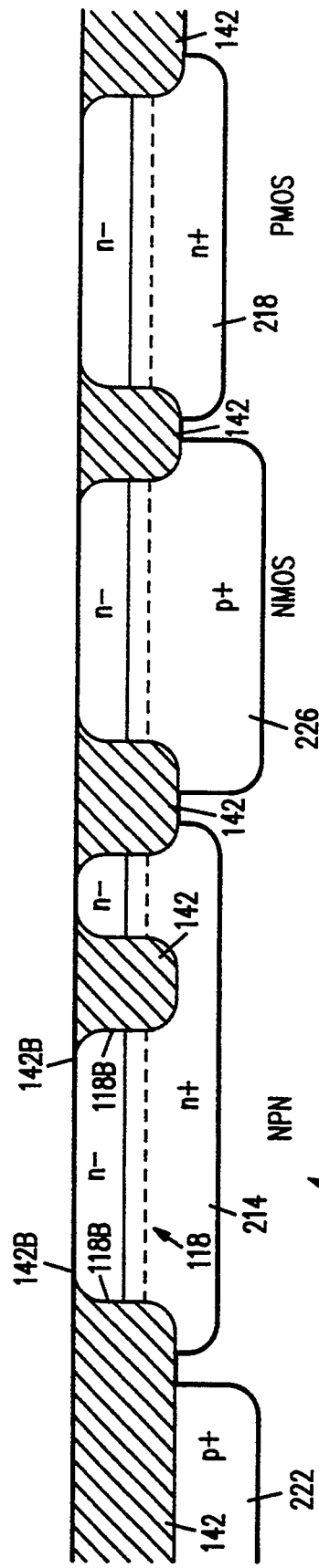
FIG. 2
FIG. 3

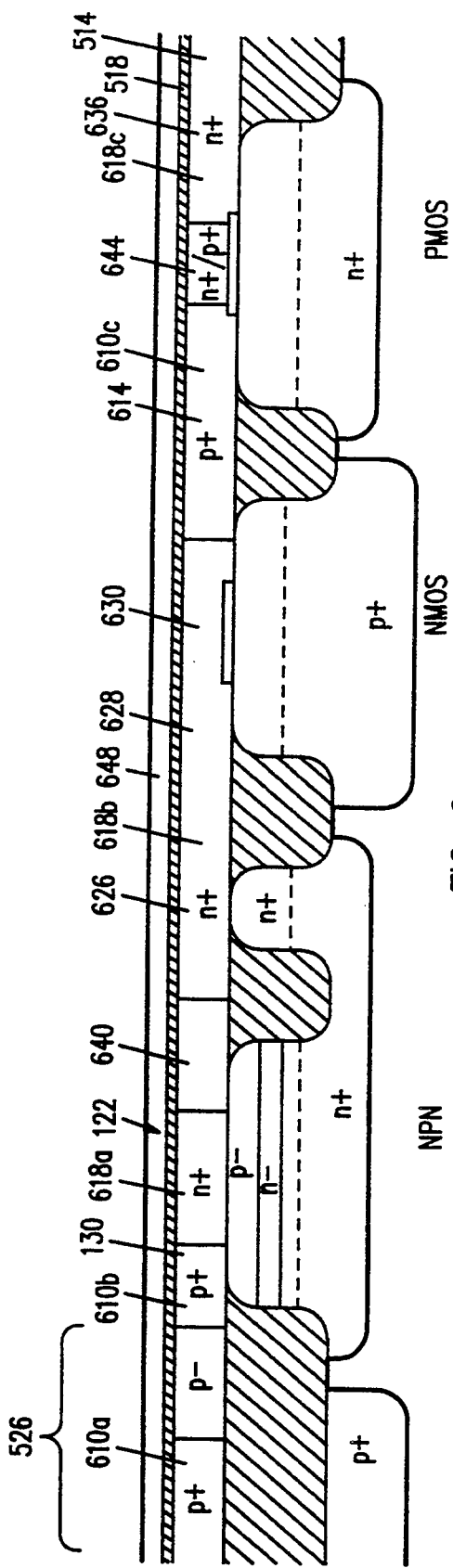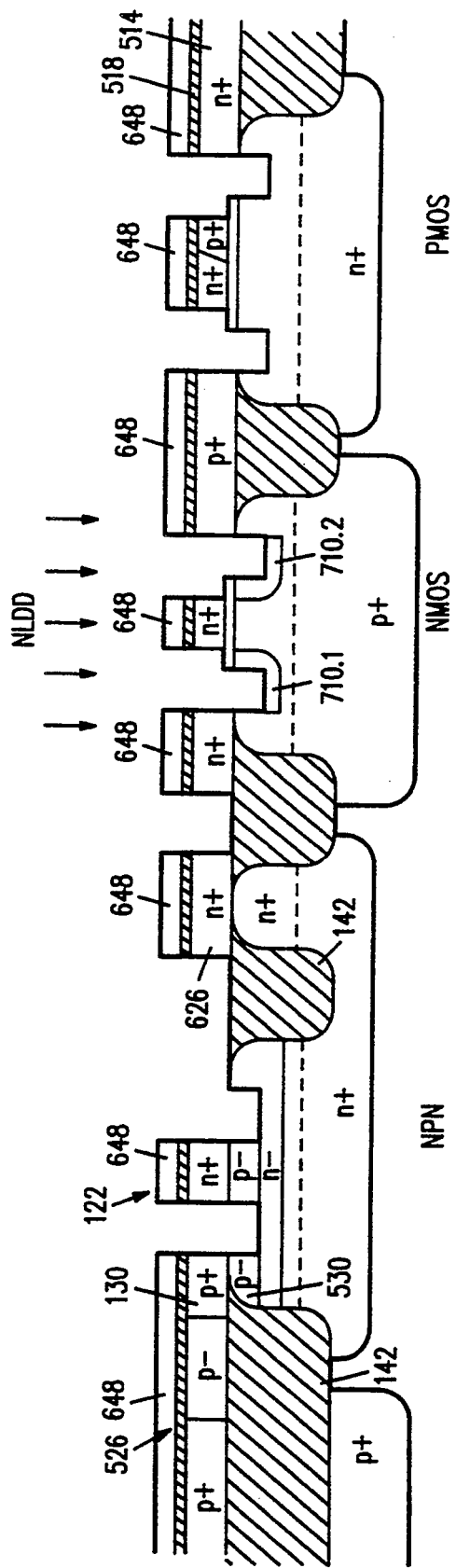

METHODS FOR FABRICATION OF TRANSISTORS

BACKGROUND OF THE INVENTION

The present invention relates to transistors, and more particularly to reducing a leakage current and a parasitic capacitance in bipolar transistors.

In bipolar transistors there often exists a relationship between the base size and the device performance. Consider, for example, the transistor in which the base overlies the collector and the emitter overlies the base. In some such transistors made for high current (and, therefore, high power) applications, base contact regions are provided on two opposite sides of the emitter to reduce base resistance and allow larger drive currents. Hence, the base is made sufficiently large to allow a sufficient overlap between the base and the base contact regions and a sufficient spacing between the base contact regions and the emitter.

In some transistors made for low power applications, only one base contact region is provided. On the side of the emitter on which no base contact region is provided the base can be made smaller. Making the base smaller leads to a smaller collector-base capacitance which in turn increases the transistor speed.

Making the base smaller is particularly advantageous in low power applications since the low power requirement tends to reduce the transistor speed. However, making the base smaller can lead to a larger collector-emitter leakage current (current ICEO defined as the collector-emitter current with open base). Indeed, suppose that the base is rectangular in plan view and is surrounded by a field insulator such as silicon dioxide. On the side of the emitter on which no base contact region is provided the corners of the rectangular base are brought closer to the emitter to make the base smaller. As is known, the proximity of the base corners to the emitter may lead to a large collector-emitter leakage current.

Another problem with bipolar transistors is a collector-base leakage current, that is, the base recombination current that flows into the collector. There is thus a need for a bipolar transistor which has lower collector-base and collector-emitter leakage currents and a low collector-base capacitance and which is suitable for high speed low power applications.

SUMMARY OF THE INVENTION

The present invention provides in some embodiments a bipolar transistor which has low collector-base and collector-emitter leakage currents and a low collector-base capacitance and which is suitable for high speed low power applications. The transistor includes in some embodiments a semiconductor isolation region laterally bounded by a field insulator, for example, by silicon dioxide. The isolation region includes the collector and the base overlying the collector. A low resistance buried layer underlies the collector and the surrounding insulator and connects the collector to a sink region that provides a low resistance contact to the buried layer. The sink region is separated from the collector by the insulator surrounding the isolation region.

The advantages of low collector-emitter and collector-base leakage currents and a low collector-base capacitance are achieved in some embodiments as follows. A base contact region is provided only on one side of the emitter. The isolation region, however, is made sufficiently large on both sides of the emitter to space the isolation region corners far from the emitter and thus to obtain a low collector-emitter leakage current. At the same time, the base is not allowed to extend laterally throughout the whole isolation region. On the side of the emitter on which no base contact region is provided, the base extends laterally, if at all, only through a portion of the isolation region. The base is thus made small. The collector-base capacitance is small as a result.

The collector-base leakage current is reduced in some embodiments by forming an additional insulator over and in contact with those corners of the isolation region which are not covered by the base contact region. More particularly, the insulator that surrounds the isolation region may encroach on the isolation region forming thin bird's beaks over the corners. If the additional insulator did not protect these bird's beaks, they could be etched back during, for example, wafer clean steps. Consequently, the collector under the bird's beaks could be exposed and shorted to the base by an overlying conductive layer such as metal silicide. The additional insulator protects the bird's beaks and keeps conductive layers away from the corners, thus reducing the collector-base leakage current.

Other features and advantages of the invention are described below. The invention is defined by the appended claims.

BRIEF DESCRIPTION OF THE DRAWINGS

FIGS. 2–13 show cross sections of a BiCMOS structure including the transistor of FIG. 1 at different stages of fabrication.

DESCRIPTION OF THE PREFERRED EMBODIMENTS

Figure 1:
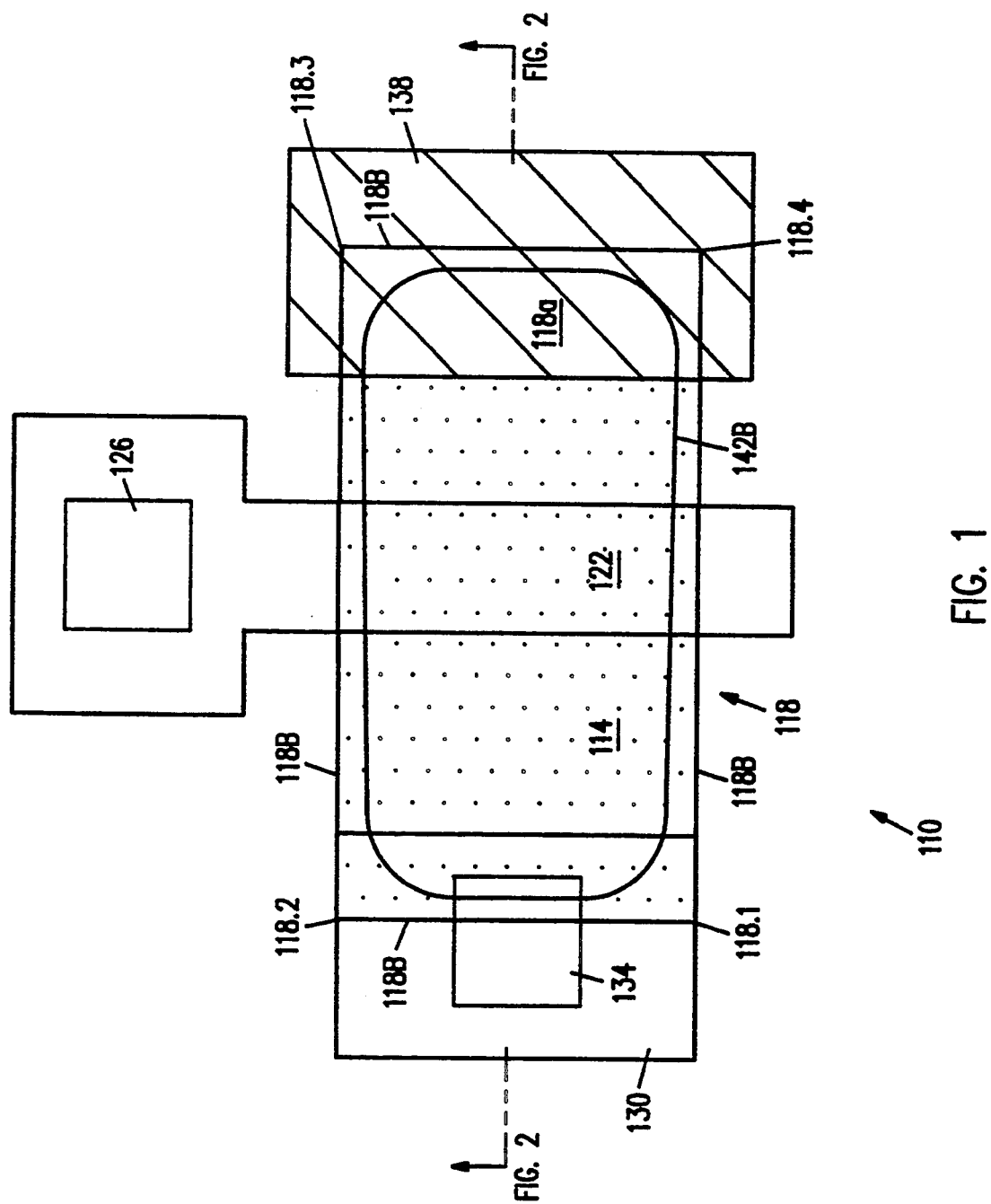
FIG. 1 shows a plan view of a bipolar transistor according to the present invention.

FIG. 1 is a plan view of bipolar transistor 110 suitable for high performance, low power applications. The transistor base 114 is formed in monocrystalline silicon isolation region 118. Region 118 is laterally bounded by an insulator such as silicon dioxide. In FIG. 1, region 118 is a rectangular region having boundary 118B and four corners 118.1, 118.2, 118.3, 118.4. Other isolation region shapes are used in other embodiments. The collector (not shown) forms part of the isolation region and underlies the base. Emitter 122 overlies the base. Emitter 122 includes a polysilicon portion that extends beyond the isolation region where it is contacted through emitter contact 126.

Base contact region 130 made of polysilicon overlies base 114 and extends beyond the isolation region. Base contact 134 allows contacting the base contact region.

As shown in FIG. 1, a base contact region is provided on the left of emitter 122 but not on the right of the emitter. However, isolation region corners 118.3, 118.4 are spaced far from emitter 122 to reduce the collector-emitter leakage current. In some embodiments, corners 118.3, 118.4 are spaced from emitter 122 by as much as corners 118.2, 118.1. Such a large spacing increases the size of isolation region 118. Nevertheless, the collector-base capacitance is small because base 114 does not extend laterally through the whole isolation region 118.

More particularly, silicon dioxide region 138 overlying isolation region 118 serves as a mask in one base doping step. A similarly shaped mask (not shown in FIG. 1) is used in another base doping step. Both masks overlie the isolation region and thus reduce the base size. The base in some embodiments extends to the right only to about the left edge of silicon dioxide region 138.

Silicon dioxide 138 reduces also the collector-base leakage current as explained below.

Transistor 110 is fabricated in some embodiments by the following BiCMOS fabrication process which provides also PMOS and NMOS transistors. The fabrication starts with forming a structure shown in cross-section in FIG. 2. Forming the structure of FIG. 2 is described in the U.S. patent application Ser. No. 07/502,943 entitled "BICMOS DEVICE AND METHOD OF FABRICATION" filed Apr. 2, 1990 by V. Ilderem et al. and hereby incorporated herein by reference. Briefly, masked implants into p-doped substrate 210 create n+ buried layer 214 for bipolar transistor 110, n+ well 218 for the PMOS transistor, p+ channel stop region 222, and p+ NMOS transistor well 226.

Next, a doped n-type epitaxial silicon layer 230 having a thickness of, for example, about 1.1 μm is grown across the surface of the substrate. Dopants from regions 222, 214, 226, 218 diffuse into the epitaxial layer.

Silicon dioxide layer 234 is thermally grown on epitaxial layer 230. Silicon nitride layer 238 is deposited over oxide 234. Oxide 234 and nitride 238 are then etched by a masked sandwich etch to form trenches around the transistors' active regions and, in particular, around isolation region 118.

The structure is then oxidized. Silicon nitride 242 is deposited, and silicon dioxide 246 is deposited on top. Oxide 246 and then nitride 242 are etched anisotropically to form spacers on the trench sidewalls. Then about 750 Å of epitaxial silicon are removed by a plasma etch leaving the structure as shown in FIG. 2.

Sidewall oxide 246 is then removed. The substrate is oxidized in a high pressure (e.g., 10 atmospheres) oxidation environment to grow field oxide 142 (FIG. 3). A portion of field oxide 142 surrounds isolation region 118.

Nitride layers 238, 242 are then removed.

As shown in FIG. 3, field oxide 142 encroaches near the surface on the transistor active regions. In particular, oxide 142 encroaches on isolation region 118 so that the oxide boundary 142B (shown also in FIG. 1) at the structure surface is farther inside the isolation region than the isolation region boundary 118B right below the surface. The oxide encroachment is particularly large near the corners such as corners 118.1 through 118.4 (FIG. 1), where the oxide grows faster than in other areas. In the corners, oxide 142 forms thin bird's beaks over the isolation region.

Figure 4:
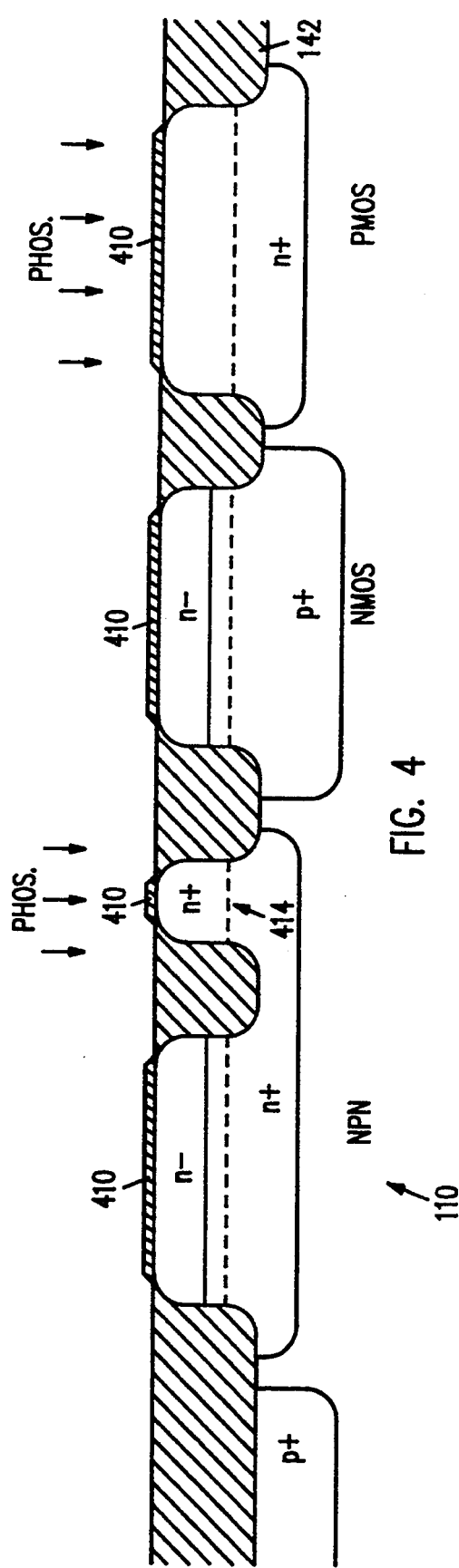

Screen oxide layer 410 (FIG. 4) is grown thermally to a thickness of about 250 Å. A mask is then formed exposing sink region 414 of the bipolar transistor. A phosphorous implant lowers the sink region resistance as described in the aforementioned U.S. patent application Ser. No. 07/502,943.

The sink mask is then removed and a separate masked ion implantation of phosphorous is performed to dope the well and channel regions of the PMOS transistor. See the aforementioned U.S. patent application Ser. No. 07/502,943.

A boron implant is then performed to adjust the threshold voltages of the NMOS and PMOS transistors as described in the aforementioned U.S. patent application Ser. No. 07/502,943.

Screen oxide 410 is then stripped and a thin silicon dioxide layer 510 (FIG. 5) is formed and patterned to provide gate oxide for the NMOS and PMOS transistors. See the aforementioned U.S. patent application Ser. No. 07/502,943.

Intrinsic polysilicon layer 514 having a thickness of about 1,000 Å to 4,000 Å, a thickness of 3,200 Å in some embodiments, is deposited across the entire surface of the substrate. A cap oxide layer 518 is formed by thermal oxidation of polysilicon 514. Photoresist mask 522 is then formed so as to expose the base region of the bipolar transistor and the regions of to-be-formed polysilicon resistors, if any. The embodiment being described includes a polysilicon resistor 526. The resistor will electrically contact the base. In some embodiments, only the NMOS and PMOS transistor regions are protected by mask 522. A boron implant is then performed and the structure is annealed. In some embodiments, the boron implant uses an energy of between 30 and 100 keV, about 30 to 50 keV in some embodiments. The dose of this implant is about $3 \times 10^{13}$ to $8 \times 10^{15}$. In some embodiments, the anneal is performed by heating the structure to 900°–950° C. for 30–60 minutes. The boron diffuses into isolation region 118 forming a p− doped region 530 having a thickness of between about 1,000 and 2,000 Å with a dopant concentration of between about $1 \times 10^{18}$ and $1 \times 10^{19}/cm^3$. The dopant concentration is about $5 \times 10^{18}/cm^3$ in some embodiments.

As illustrated in FIG. 6, a mask (not shown) is formed which exposes the regions 610a, 610b, and 610c which will eventually be a portion of resistor 526, base contact region 130, and source/drain contact region 614 of the PMOS and NMOS transistors. The exposed regions are doped p+ by boron to a concentration of between about $1 \times 10^{19}$ and $1 \times 10^{20}/cm^3$, a concentration of about $6 \times 10^{19}/cm^3$ in some embodiments. The p+ mask is removed and another mask (not shown) is formed on the surface of the structure to expose regions 618a, 618b, and 618c which will eventually be used for bipolar emitter 122, bipolar collector contact region 626, source/drain contact region 628 of the NMOS transistor, gate 630 of the NMOS transistor, and source/drain contact region 636 of the PMOS transistor. Region 640 between regions 618a and 618b is also exposed in some embodiments, and in other embodiments is not exposed to remain undoped. The exposed regions are doped n+ using an arsenic implant with an energy of about 100 keV to a concentration of between about $5 \times 10^{19}$ and $1 \times 10^{20}/cm^3$. PMOS gate 644 may be either n+ or p+ and thus may be doped by either the n+ or the p+ implant.

A silicon nitride layer 648 having a thickness of between about 1,000 and 1,200 Å is then deposited for the purpose of preventing oxidation of the polysilicon during following steps and preventing the PLDD implant (described below) from going into gates and emitters. Polysilicon layer 514 is then annealed at 900° C. for about 15 minutes.

Next, a mask (not shown) is formed on the surface of the nitride to protect emitter 122, the base and collector contact regions 130, 626 of the bipolar transistor and the sources, drains and gates of the NMOS and PMOS transistors. A dry etch with chlorine chemistry results in the structure shown in FIG. 7. As shown, the etch is conducted so as to etch the epitaxial region by about 1,000 to 2,000 Å below the original epitaxial surface. As a result, the exposed portions of the p doped region 530 are etched away. The p doped region 530 is so shallow under the oxide 142 encroachment to the right of the emitter that region 530 under the encroachment is etched away in some embodiments. In other embodiments, a portion of region 530 under the oxide encroachment remains, but the n type dopant diffusion from the collector during subsequent processing steps counterdopes the lightly doped small remaining portions of region 530 under the encroachment to make the isolation region under the encroachment to the right of the emitter entirely n type.

The etch mask is then removed. A masked or blanket NLDD (NMOS lightly doped drain) implant is performed in which the source and the drain of the NMOS transistor are lightly implanted with an n type dopant such as phosphorous using an implant energy of between about 20 and 50 keV, between about 20 and 40 keV in some embodiments. This implant results in source and drain regions 710.1, 710.2 with a dopant concentration of between about $5 \times 10^{17}$ and $1 \times 10^{19}/cm^3$.

Figure 8:
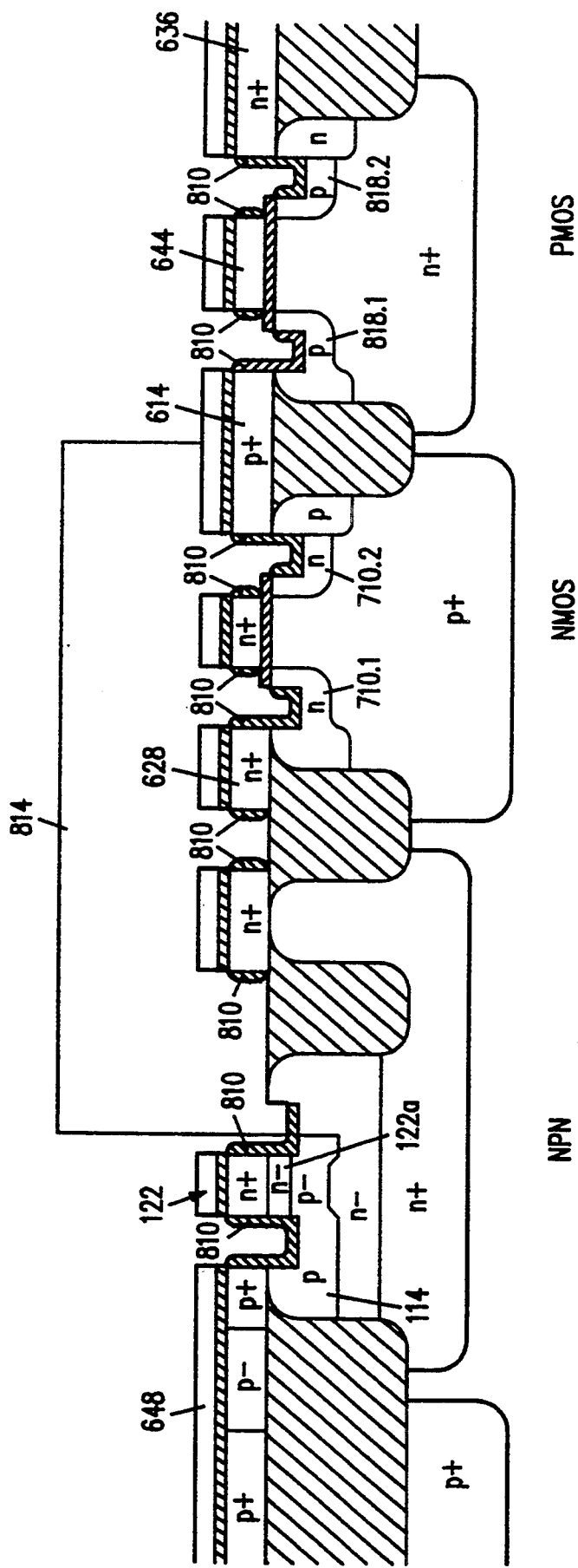

Cap oxide 810 (FIG. 8) is then formed by thermal oxidation. Photoresist mask 814 is then formed to expose the PMOS transistor and a portion of base 114 of the bipolar transistor. A p type PLDD (PMOS lightly doped drain) implant is then performed to dope the source and drain regions 818.1, 818.2 of the PMOS transistor and the exposed base portion of the bipolar transistor. The dopant is $BF_2$ in some embodiments. The resulting net dopant concentration in the exposed base portion and in source/drain regions 818.1, 818.2 is between about $5 \times 10^{17}$ and $1 \times 10^{19}/cm^3$. The implant energy is between about 40 and 60 keV. As shown, more heavily doped well ties are also diffused from the NMOS and PMOS contact regions 628, 614, 636 into the epitaxial layer. Emitter region 122a is diffused from the overlying polysilicon portion of emitter 122.

Figure 9:
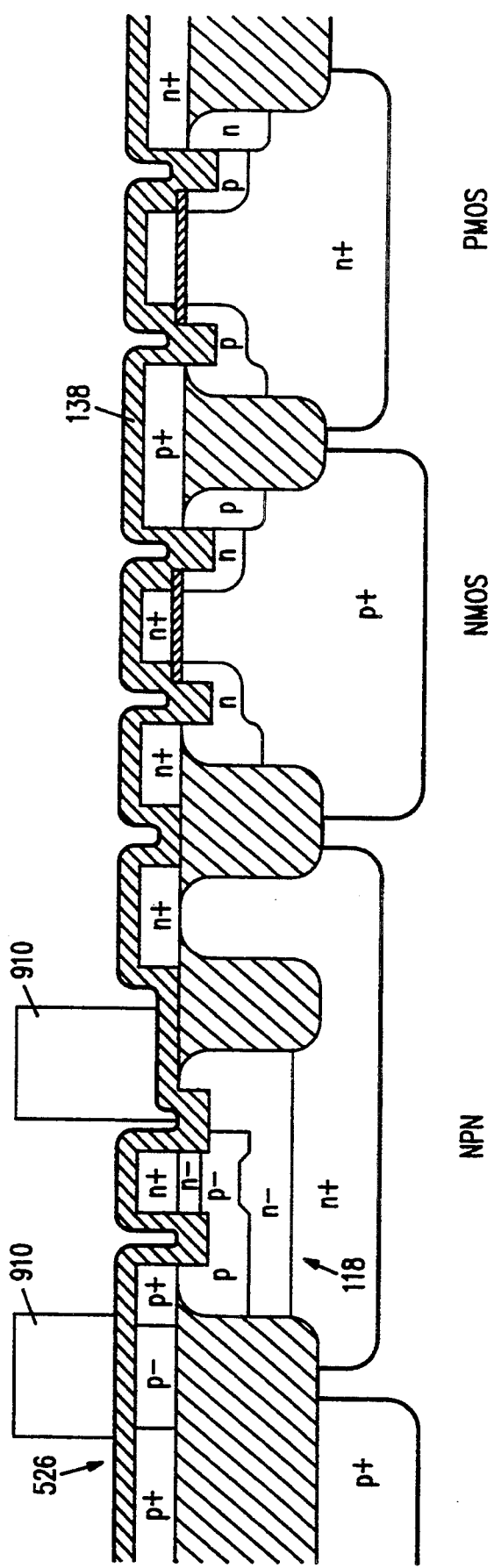

Referring to FIG. 9, nitride 648 is stripped and conformal silicon dioxide layer 138 is formed by Low Temperature Oxide (LTO) deposition to a thickness of about 2000–2500 Å. "Silicide exclusion" oxide 138 will protect certain silicon surfaces from silicidation as explained below.

"Silicide exclusion" mask 910 is formed of photoresist over the polysilicon regions where metal silicide formation is not desired. In particular, mask 910 covers a portion of isolation region 118 on the right of emitter 122. Mask 910 overlies also a portion of resistor 526.

Figure 10:
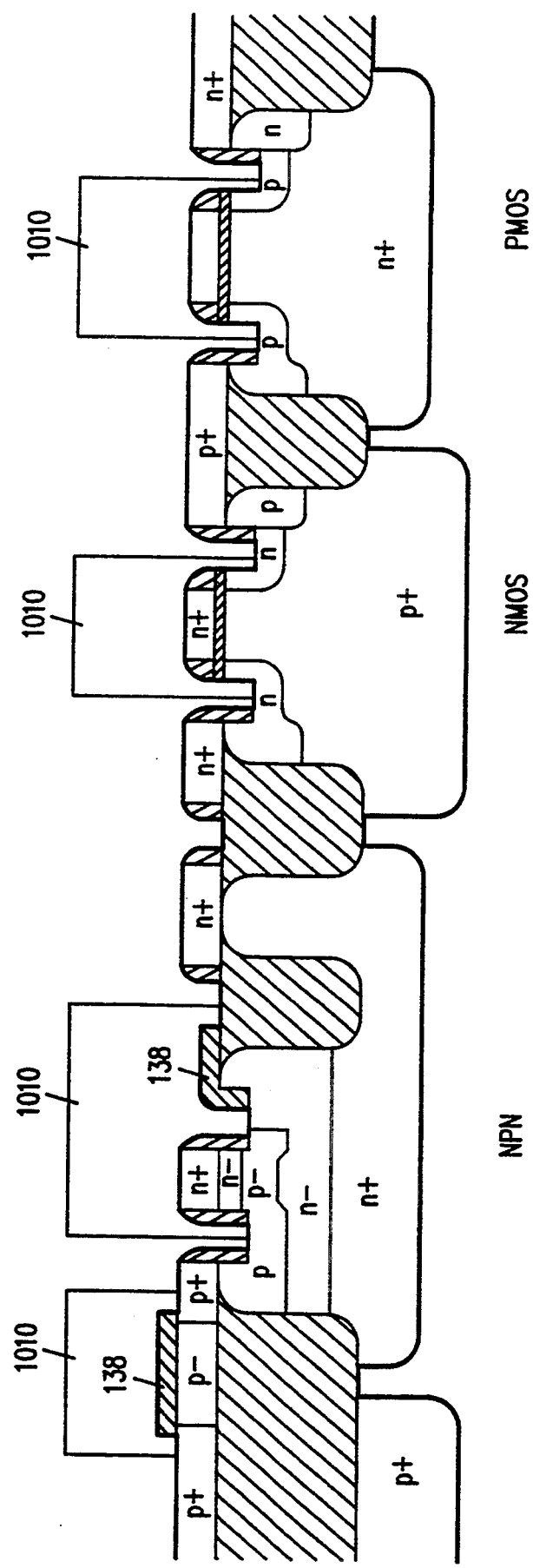

Oxide 138 is then etched anisotropically leaving spacer oxide on exposed sides of the source and drain contact regions, the gates, the emitter, the base contact region, and the collector contact region using means known to those of skill in the art. See FIG. 10.

Figure 11:
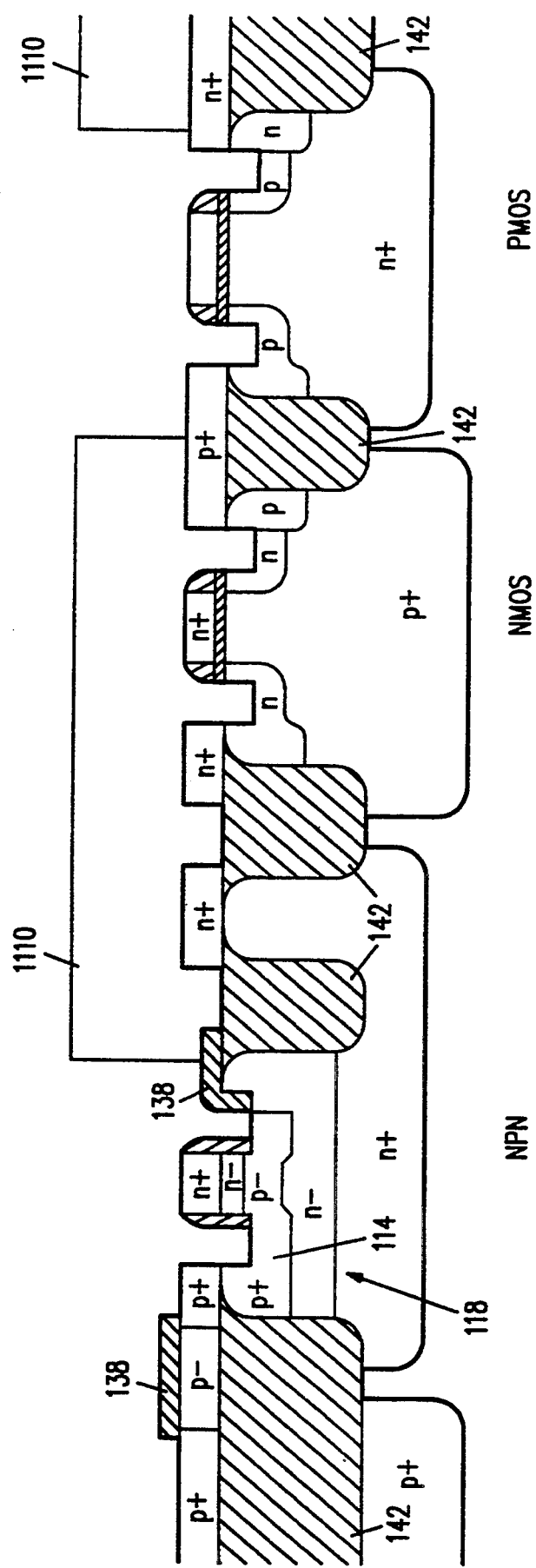

Mask 1010 is then formed to protect oxide 138 on emitter 122, on the gates of the NMOS and PMOS transistors, and on resistor 526. The structure is etched with BOE (buffered oxide etch) for about one minute and, as shown in FIG. 11, oxide 138 is removed from the sidewalls of the base and collector contact regions and of the source and drain contact regions of the NMOS and PMOS transistors.

Mask 1110 (FIG. 11) is then formed to expose insulation region 118 and the PMOS transistor. A heavy p+ ($BF_2$) implant is then performed. This implant lowers the resistances of the source and drain of the PMOS transistor and of the extrinsic base region. The implant uses an energy of between about 40 and 60 keV.

During this implant, oxide 138 masks portion 118a of the isolation region preventing base 114 from extending throughout the top of isolation region. The base size is reduced as a result. The exposed portion of the base is converted to p conductivity type. Portion 118a retains the n− conductivity type.

Mask 1110 is then removed. Another mask (not shown) is formed to expose the NMOS transistor. An n+ (arsenic) implant is performed to lower the source and drain resistances of the NMOS transistor. The implant energy is between about 50 and 100 keV.

The structure is then optionally annealed at a temperature of about 900° to 950° C. for about 10 to 30 minutes or at a temperature of 1000° to 1100° C. for about 10 to 30 seconds using a rapid thermal annealing process.

Figure 12:
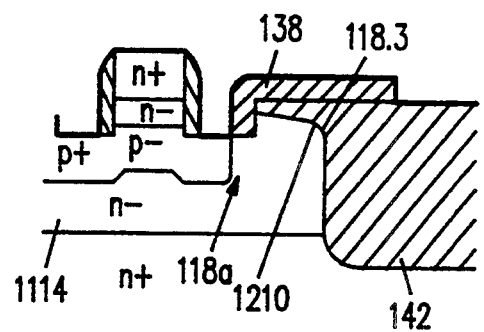

The structure is then prepared to silicidation. The wafer clean steps include a short blanket oxide etch to remove silicon oxide which could have formed on the silicon surfaces not protected by oxide layers 138, 142. This oxide etch removes only a small portion of oxide 138, 142. Silicide exclusion oxide 138 protects during this etch the underlying encroachment of oxide 142 on isolation region 118. See FIG. 12 illustrating the cross section of the structure of FIG. 1 along the diagonal plane passing through corners 118.3, 118.1. As described above, field oxide 142 forms thin bird's beaks over isolation region 118 in the corners. If silicide exclusion oxide 138 had been etched away over the bird's beaks and the adjacent portion of isolation region 118, the short oxide etch could remove sufficient oxide 142 to expose collector 1114, and the subsequently formed metal silicide could short the collector to the base.

Of note, if oxide 138 had been etched away over the bird's beaks and the adjacent portion of isolation region 118, base 114 would extend to the bird's beaks due to the heavy p+ implant described above in connection with FIG. 11. The p dopant could diffuse laterally under the bird's beaks. In that case, the short oxide etch performed before the silicidation could expose the thin p doped base portion formed by the lateral diffusion. Even if the collector were not exposed, the thin base portion could be consumed by silicide during the silicide formation in which case the silicide would contact the underlying collector forming a collector-base short.

Figure 13:
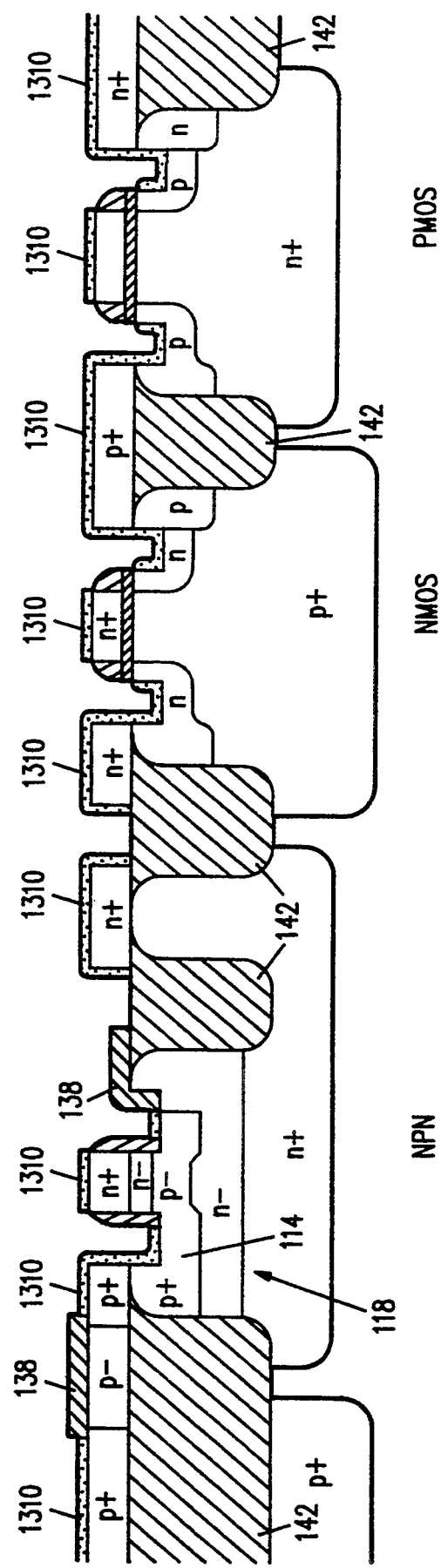

A layer of refractory metal such as titanium, molybdenum, tantalum, tungsten, or the like, is deposited and heated to form metal silicide 1310 (FIG. 13) in the regions where the deposited metal contacts silicon. (FIG. 13 shows the cross section of the structure along the same plane as FIG. 2.) The unreacted metal is then etched away leaving the structure as shown in FIG. 13.

An insulator such as silicon dioxide (not shown) is deposited and contact holes are formed therein. Metal contacts are formed in the contact holes. Additional metallization layers are formed if needed. The structure is then passivated. See the aforementioned U.S. patent application Ser. No. 07/502,943.

Figure 14:
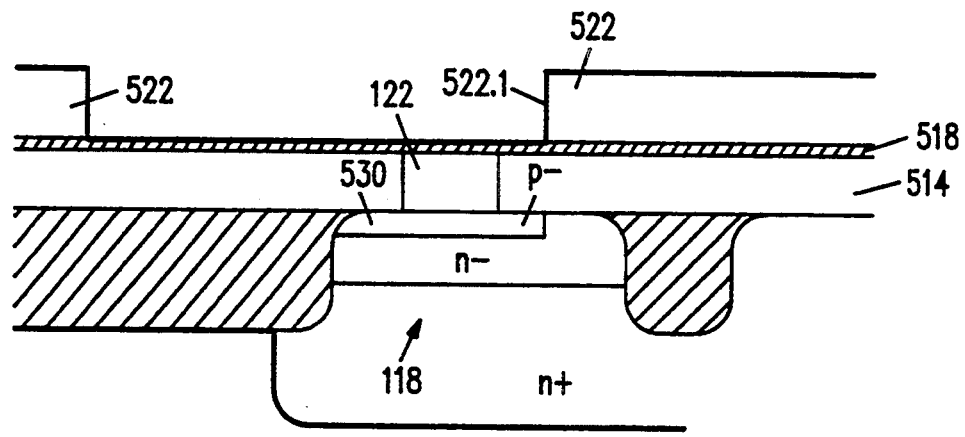
FIG. 14 shows a cross section of a bipolar transistor of the present invention at one stage of fabrication.

In some embodiments, the etch that patterns polysilicon 514 (FIG. 7) does not remove entirely the exposed portions of p doped region 530. In order to reduce region 530 and thus to reduce the base size, in some embodiments polysilicon doping mask 522 (FIG. 5) overlaps isolation region 118 as shown in FIG. 14. If left edge 522.1 of the mask portion to the right of emitter 122 is closer to emitter 122 than silicide exclusion mask 910 (FIG. 9) then the base will not extend under silicide exclusion oxide 138 (except, possibly, by a small amount due to the lateral dopant diffusion).

Figure 15:
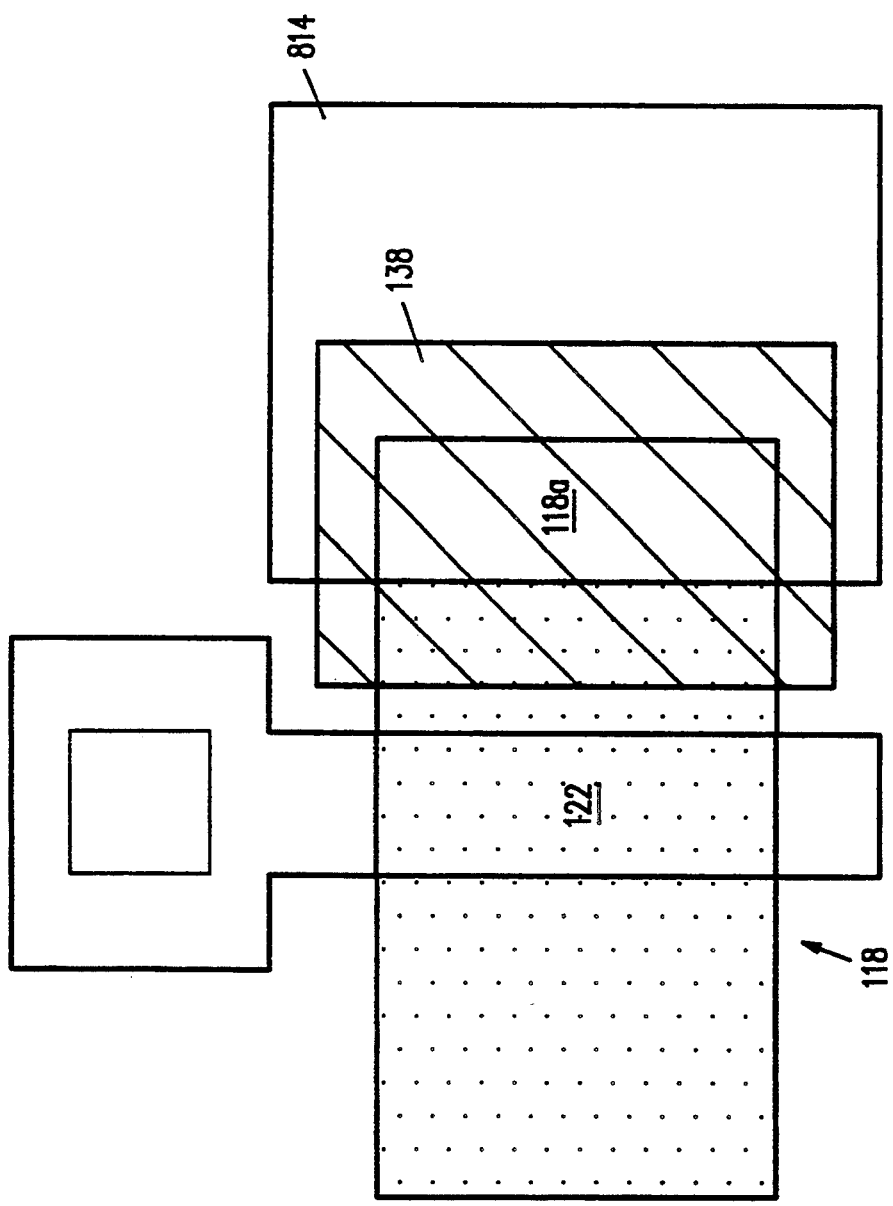
FIGS. 15 and 16 show plan views of bipolar transistors according to the present invention.

PLDD mask 814 (FIG. 8) comes from the right closer to the emitter than silicide exclusion mask 910 (FIG. 9). Hence the right edge of the base portion is defined by silicide exclusion mask 910. In FIG. 15, on the contrary, silicide exclusion mask 910 and, therefore, silicide exclusion oxide 138 come from the right closer to the emitter than PLDD mask 814. Hence, the right edge of the base is defined by PLDD mask 814. Metal silicide 1310 (FIG. 13) is, therefore, spaced laterally farther from the isolation region portion 118a (FIG. 1) underlying the silicon exclusion oxide. This is believed to reduce the collector-base leakage current.

Figure 5:
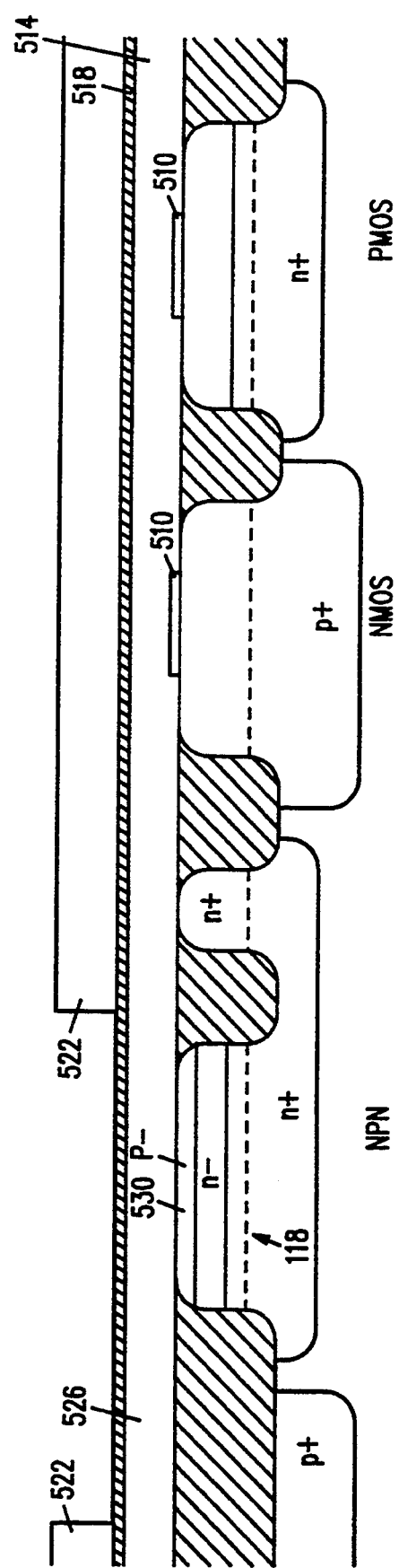

If left edge 522.1 (FIG. 14) is farther from the emitter than PLDD mask 814 and silicide exclusion mask 910 and if the polysilicon etch of FIG. 7 does not remove the exposed portions of p doped region 530, then the right edge of the base is defined by mask 522. The invention is not limited by any particular mutual alignment of masks 814, 910 and 522 (FIGS. 5, 14).

Figure 17:
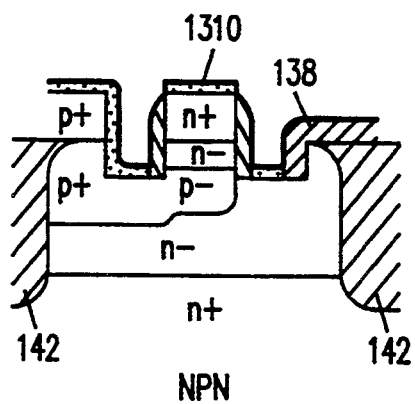
FIG. 17 shows a cross section of the transistor of FIG. 16.
Figure 16:
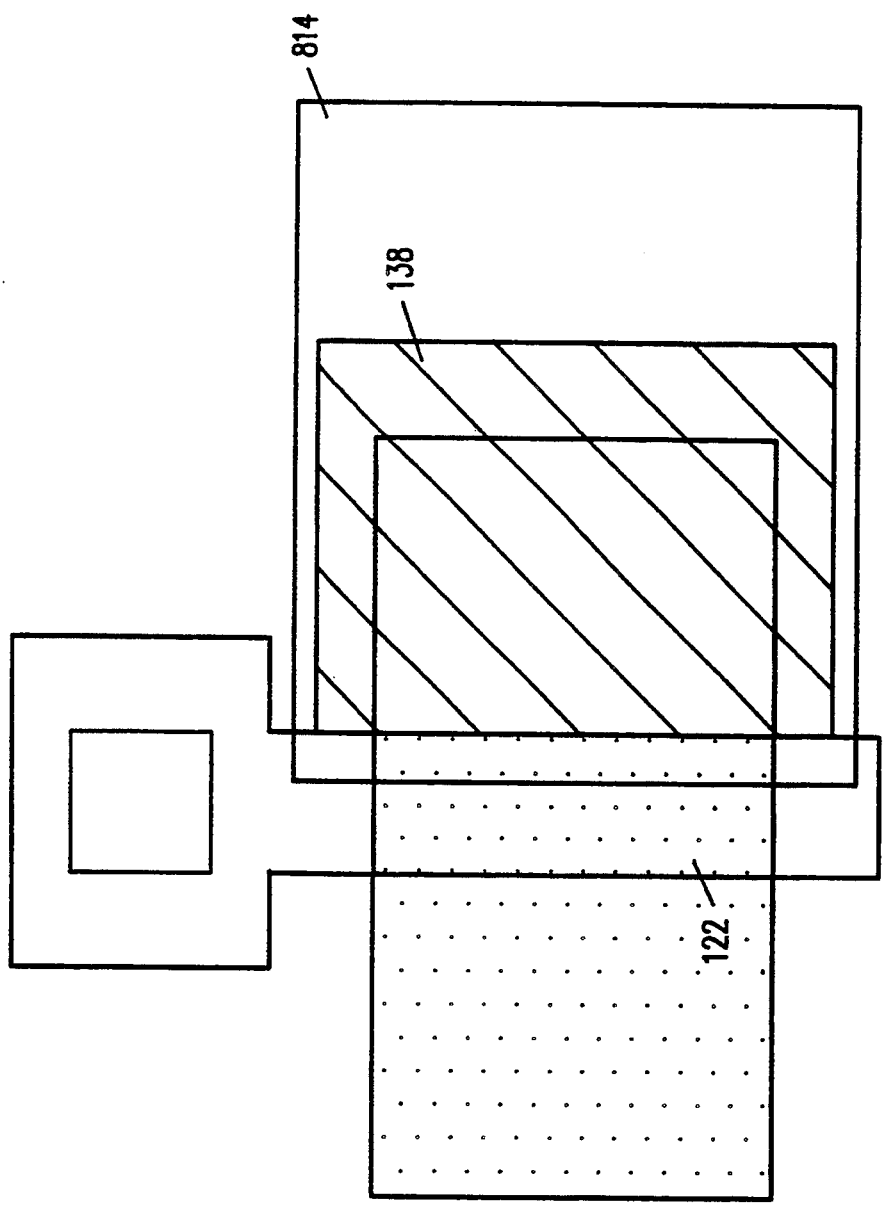

In FIGS. 16 and 17, the base does not extend to the right of the emitter except, possibly, due to the lateral dopant diffusion. PLDD mask 814 overlaps the emitter to prevent the PLDD implant from doping the isolation region to the right of the emitter. Silicide exclusion mask 910 comes so closely to the emitter on the right that the etch of oxide 138 described above in connection with FIG. 9 leaves the portion of isolation region 118 to the right of the emitter completely covered by the oxide. The base size, and hence the collector-base capacitance, are further reduced as a result.

Figure 18:
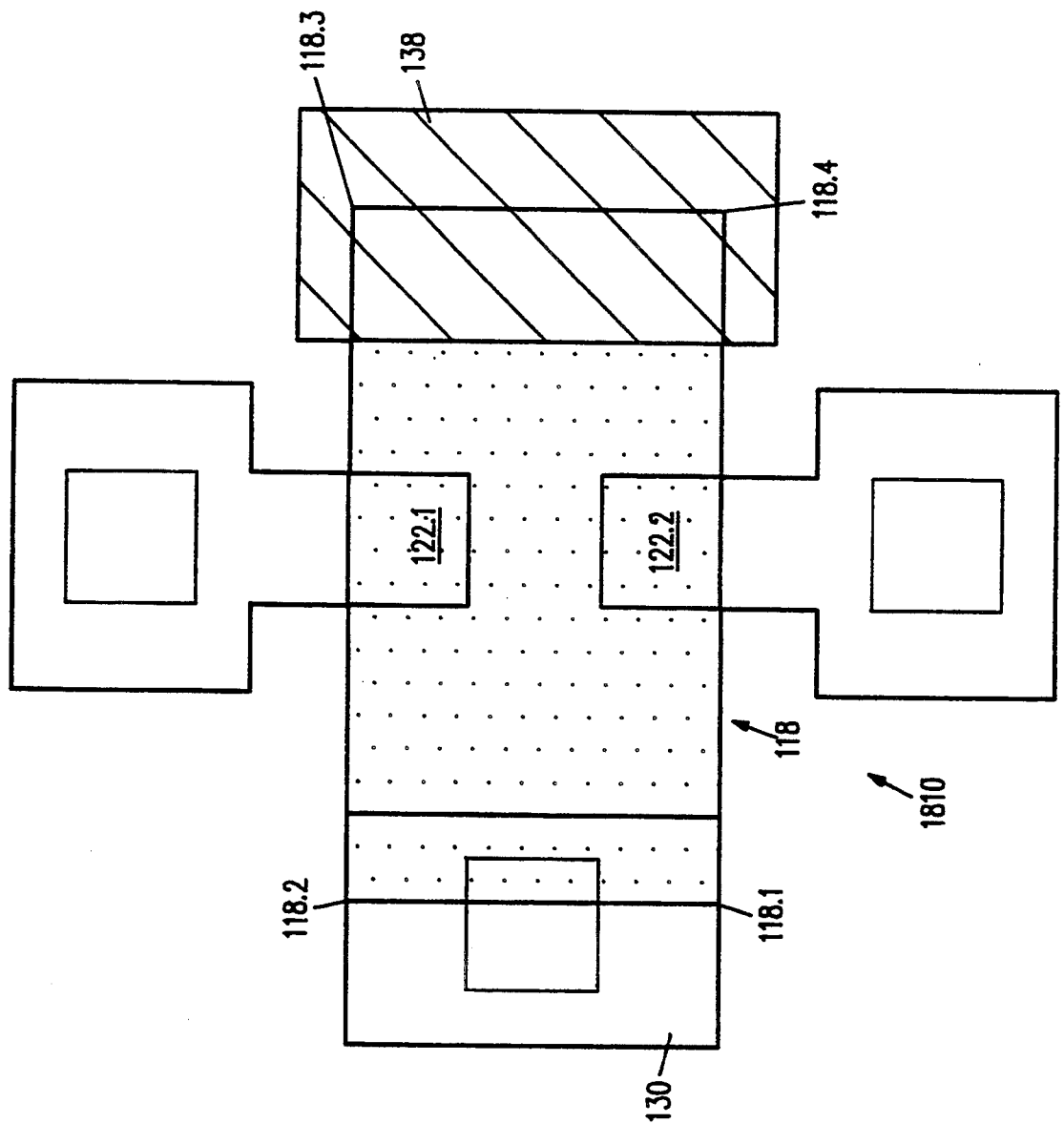
FIG. 18 shows a plan view of a bipolar transistor according to the present invention.

FIG. 18 illustrates a bipolar transistor 1810 having two three-sided emitters 122.1, 122.2. Three-sided emitters are described in the U.S. patent application Ser. No. 07/951,524 entitled "TRANSISTORS AND METHODS FOR FABRICATION THEREOF" filed Sep. 25, 1992 by A. A. Iranmanesh et al. and hereby incorporated herein by reference. Corners 118.3, 118.4 of isolation region 118 which are not covered by base contact region 130 are covered by silicide exclusion oxide 138.

Other embodiments include transistors with any number of emitters. Isolation region corners are covered by silicide exclusion oxide. The relative positions of the silicide exclusion mask, the PLDD mask and the polysilicon doping mask such as mask 522 (FIG. 5) vary between the embodiments. Thus in some embodiments of transistor 1810, the base does not extend to the right of emitters 122.1, 122.2 under the field oxide encroachment.

While the invention has been illustrated with respect to the embodiments described above, other embodiments and variations are within the scope of the invention. In particular, the invention covers non-BiCMOS integrated circuits which do not have MOS transistors. An example of a bipolar process to which the present invention is applicable is described in the U.S. patent application Ser. No. 07/503,498 entitled "HIGH PERFORMANCE SEMICONDUCTOR DEVICES AND THEIR MANUFACTURE" filed Apr. 2, 1990 by A. G. Solheim et al. and hereby incorporated herein by reference. The invention covers PNP transistors. In some PNP transistor embodiments, the base implants include an NLDD implant used to create an LDD structure in an NMOS transistor. The invention is not limited to any particular dopants, dopant doses and concentrations, or feature sizes and layer thicknesses. Further, the invention is not limited to any particular materials. For example, silicon dioxide 138 is replaced by silicon nitride in some embodiments. Other insulators are used in other embodiments. Still other embodiments and variations are within the scope of the invention as defined by the following claims.

We claim:
1. A method for forming a semiconductor structure, said method comprising the steps of:
    forming a structure S1 comprising:
        a contiguous semiconductor region laterally surrounded by an oxide insulator and comprising:
            a collector of a first conductivity type; and
            an emitter of the first conductivity type overlying the collector;
        a buried layer of said first conductivity type underlying the collector and said insulator; and
        a sink region of said first conductivity type contacting the buried layer, the sink region being separated from the collector by a first portion of said insulator;
    masking a portion P1 of said contiguous semiconductor region with a dopant mask;
    introducing a dopant having a second conductivity type opposite to the first conductivity type into an unmasked portion P2 of said contiguous semiconductor region so that at least a part of the portion P1 would not acquire the second conductivity type, said steps of masking and introducing said dopant being used to form a base of said second conductivity type formed at least partially overlying said collector, said base extending only a partial length of said semiconductor region so as to be separated from said first portion of said insulator;
    forming an insulator I1 over and in contact with at least a part of the portion P1; and
    forming a conductive material over and in contact with at least a part of said contiguous semiconductor region which part is exposed by the insulator I1, said conductive material having a lower resistivity than the portion P2.

2. The method of claim 1 wherein:
said structure S1 further comprises:
    a semiconductor region SR1 which includes a body of a field effect transistor, the body having the first conductivity type; and
    a gate of said field effect transistor which gate overlies said body; and
said dopant introducing step comprises the step of introducing a dopant into said semiconductor region SR1 to dope source and drain regions of said field effect transistor.

3. The method of claim 2 wherein said step of introducing dopant into the semiconductor region SR1 comprises the step of performing an LDD implant for said field effect transistor.

4. The method of claim 1 wherein the insulator I1 completely covers the portion P1.

5. The method of claim 1 wherein the insulator I1 covers a part of the portion P1 and the conductive material covers another part of the portion P1.

6. The method of claim 5 further comprising the step of introducing a dopant of the second conductivity type into said contiguous semiconductor region while the insulator I1 acts as a dopant mask.

7. The method of claim 1 wherein said step of forming a structure S1 comprises the steps of:
   forming a contiguous semiconductor region SR2 bounded by said insulator and comprising the collector;
   forming a semiconductor layer over the region SR2;
   masking a portion of the semiconductor layer which portion overlies a portion of region SR2 adjacent said insulator; and
   introducing a dopant D1 of the second conductivity type into an unmasked portion of the semiconductor layer and causing dopant D1 to diffuse into the region SR2, thereby doping at least a portion of a base of said transistor.

8. The method of claim 1 wherein said emitter is formed overlying said base and directly contacting said base, said emitter being separated from said sink region by a distance necessary to achieve a desired emitter-collector leakage current while a length of said base across said semiconductor region is substantially independent of said distance between said emitter and said sink region.

9. The method of claim 1 further comprising the step of forming a silicide portion contacting a surface of said base and self-aligned with said base.

10. A method of forming a transistor, said method comprising the steps of:
   forming a structure comprising:
      a contiguous semiconductor region having a top surface, said region being laterally surrounded by an insulator I1 exhibiting a bird's beak at an interface of said insulator I1 and said top surface of said region, said region comprising:
         a collector;
         a base overlying the collector; and
         an emitter overlying the base;
      then forming an insulator I2 overlying said bird's beak at said interface and contacting a portion P2 of the top surface of said contiguous semiconductor region and a portion P3 of said insulator I1, said insulator I2 acting to protect said bird's beak during subsequent processing of a wafer containing said semiconductor region; and
      forming a conductive material, having a lower resistivity than said base, overlying and contacting a portion P1 of said base which portion is exposed by the insulator I2.

11. The method of claim 10 wherein said material comprises metal silicide.

12. The method of claim 10 wherein said portion P2 is adjacent at least one corner of said contiguous semiconductor region.

13. The method of claim 12 further comprising the step of forming a base contact region over and in contact with said base wherein the base contact region covers at least one corner of said contiguous semiconductor region which is not covered by said insulator I2.

14. The method of claim 10 wherein said collector and said base are formed of monocrystalline silicon.

15. The method of claim 10 wherein said conductive material is a silicide formed self-aligned with said portion P1 of said base and said insulator I2.

* * * * *